United States Patent
Shen et al.

(10) Patent No.: US 7,639,088 B2
(45) Date of Patent: Dec. 29, 2009

(54) PHASE-LOCKED LOOP START-UP TECHNIQUES

(75) Inventors: David H. Shen, San Jose, CA (US); Ann P. Shen, Saratoga, CA (US); Axel Schuur, Mountain View, CA (US)

(73) Assignee: NanoAmp Mobile, Inc., Santa Clara, CA (US)

( * ) Notice: Subject to any disclaimer, the term of this patent is extended or adjusted under 35 U.S.C. 154(b) by 132 days.

(21) Appl. No.: 12/110,048

(22) Filed: Apr. 25, 2008

(65) Prior Publication Data

US 2009/0085622 A1 Apr. 2, 2009

Related U.S. Application Data

(60) Provisional application No. 60/975,733, filed on Sep. 27, 2007.

(51) Int. Cl.
 H03L 7/10 (2006.01)
 H03L 7/18 (2006.01)
 H04B 1/00 (2006.01)

(52) U.S. Cl. .............................. 331/16; 331/18; 331/25; 455/260

(58) Field of Classification Search ................. 331/1 A, 331/4, 8, 14, 16–18, 25, DIG. 2; 327/156–159; 332/127; 360/51; 375/376; 455/260
See application file for complete search history.

(56) References Cited

U.S. PATENT DOCUMENTS

| 5,068,625 | A | 11/1991 | Baker et al. |
| 5,193,005 | A | 3/1993 | Tomita |
| 5,420,545 | A | * | 5/1995 | Davis et al. .................... 331/17 |
| 5,790,613 | A | | 8/1998 | Tateishi |
| 6,078,634 | A | | 6/2000 | Bosshart |
| 6,211,743 | B1 | | 4/2001 | Rhee et al. |
| 6,256,362 | B1 | | 7/2001 | Goldman |
| 6,396,353 | B1 | * | 5/2002 | Krobel et al. ................. 331/16 |
| 6,441,691 | B1 | | 8/2002 | Jones et al. |
| 6,622,255 | B1 | | 9/2003 | Kurd et al. |
| 6,643,499 | B1 | | 11/2003 | Audinot et al. |
| 6,680,632 | B1 | | 1/2004 | Meyers et al. |
| 6,922,047 | B2 | | 7/2005 | Knoll et al. |
| 7,003,065 | B2 | | 2/2006 | Homol et al. |
| 7,015,768 | B1 | | 3/2006 | Talwalker |
| 2005/0280473 | A1 | | 12/2005 | Puma et al. |

OTHER PUBLICATIONS

International Search Report, Application Serial No. PCT/US2008/062048, dated Jul. 21, 2008, 9 pages.

* cited by examiner

*Primary Examiner*—David Mis
(74) *Attorney, Agent, or Firm*—Fish & Richardson P.C.

(57) ABSTRACT

Implementations feature systems and techniques for phase-locked loops (PLLs). In some aspects, implementations feature a system that has a PLL circuit including an oscillator and programmable reference frequency divider circuit or a programmable feedback frequency divider circuit. The PLL includes a control circuit to reduce a time required for a PLL settling time by programming a division value into the programmable reference frequency divider circuit and/or the programmable feedback frequency divider circuit to target the oscillator to operate outside of a system operating frequency range of the oscillator during start-up of PLL operations. The control circuit can program another division value into the programmable reference frequency divider circuit and/or the programmable feedback frequency divider circuit after stabilization of the variable oscillator.

29 Claims, 5 Drawing Sheets

PHASE-LOCKED LOOP START-UP TECHNIQUES

CROSS-REFERENCE TO RELATED APPLICATIONS

This application claims priority to U.S. Provisional Application No. 60/975,733, filed on Sep. 27, 2007, the disclosure of which is incorporated by reference.

TECHNICAL FIELD

This disclosure relates to phase-locked-loops (PLLs), such as PLLs in radio frequency (RF) circuits.

BACKGROUND

A phase-locked loop (PLL) is a circuit that generates a signal that is a function of a reference signal. PLLs are widely used in electrical systems, particularly communication systems, at least for their ability to perform various circuit functions, such as generating programmable output frequencies, and performing frequency modulation and demodulation. PLLs are also useful for performing carrier signal regeneration, generating clock signals, and performing clock recovery and skew compensation.

PLLs require a certain amount of time in operation to lock to a desired frequency when the PLL is required to change from one frequency to another frequency. This may be referred to as the "lock time." The lock time of the PLL can be a particular requirement of an intended application of the PLL. A settling time can refer to the time needed for the PLL to settle to a desired frequency within a desired frequency error tolerance window. The terms, locking time and settling time, may loosely refer to the same time necessary for the PLL to lock.

SUMMARY

Generally, implementations provide a circuit design framework for a low-cost way to speed up the PLL settling or locking time during a start-up transient process of the PLL. The start-up process of a PLL generally involves the time when the PLL commences operating, or when an operating frequency of the PLL changes and the PLL commences to lock to a new operating frequency.

In general, in one aspect, implementations feature a method of operating a phase-locked loop (PLL) that includes a variable oscillator. The method includes, in a first time period, programming a first reference division factor into a reference frequency divider circuit or a first feedback division factor into a feedback frequency divider circuit, where the first reference division factor or the first feedback division factor causes the variable oscillator to operate outside a system operating frequency range of the variable oscillator. In a second time period, the method involves programming a second reference division factor into the reference frequency divider circuit or a second feedback division factor into the feedback frequency divider circuit, in which the second time period occurs immediately after the first time period. The second reference division factor or the second feedback division factor causes the PLL to lock to a target PLL output system operating frequency. The reference frequency divider circuit is configured to divide a crystal reference frequency, and the feedback frequency divider circuit is configured to divide a frequency of the variable oscillator.

These and other implementations can optionally include one or more of the following features. The first feedback division factor can be programmed to a maximum division factor. When the variable oscillator is stabilized, the method can involve programming the second feedback division factor to be a steady-state frequency division factor for the target PLL system operating frequency during the second time period. The first reference division factor or the first feedback division factor can be programmed to a target PLL output frequency that is at or near an upper-most or highest range value of a target PLL output system operating frequency range. The second reference division factor or the second feedback division factor can be programmed to be a steady-state frequency division factor for the target PLL output system operating frequency when the variable oscillator is stabilized.

The target PLL output frequency can be a function of the division factors and the reference frequency. The first feedback division factor or the first reference division factor can be programmed to be a minimum division factor. When variable oscillator is stabilized, the method can involve programming the second feedback division factor or the second reference division factor to be a steady-state frequency division factor for the target PLL output system operating frequency. The first reference division factor or the first feedback division factor can be programmed to set a target PLL output frequency to be at or near a lowest range value of a target PLL output system operating frequency range. When the frequency of the variable oscillator is stabilized, the method can involve programming the second feedback division factor or the second reference division factor to be a steady-state frequency division factor for the target PLL output system operating frequency.

A ratio of the first feedback and first reference division factors can be programmed to the feedback frequency divider circuit and the reference frequency divider circuit to set a target PLL output frequency to be outside an oscillator system operating frequency range. The variable oscillator and the PLL can include a frequency range with a minimum frequency that is less than a lowest frequency of a PLL output system operating frequency range, and a maximum frequency that is greater than an upper-most or highest frequency of the PLL output system operating frequency range. The PLL can be an analog PLL, a digital PLL, or a mixed-signal PLL.

A ratio of the first feedback and first reference division factors can be programmed to the feedback frequency divider circuit and the reference frequency divider circuit to set a target PLL output frequency to be at or near a lowest or an upper-most frequency of an oscillator system operating frequency range. The method can involve increasing a PLL loop bandwidth, pre-charge a loop filter node, or pre-tuning the variable oscillator during the first time period. The programming in the first time period can include setting a ratio of the first reference division factor and the first feedback division factor to adjust the target PLL output system operating frequency.

In general, in another aspect, implementations feature a circuit including a phase-locked loop (PLL) with a variable oscillator. The circuit includes a reference frequency divider circuit configured to divide a reference frequency, a feedback frequency divider circuit configured to divide a frequency of the variable oscillator, and a control circuit. The control circuit is configured to program a first reference division factor into the reference frequency divider circuit or a first feedback division factor into the feedback frequency divider circuit in a first time period, where the first reference division factor or the first feedback division factor causes the variable oscillator to operate outside a system operating frequency range of the variable oscillator. The control circuit is also configured to program a second reference division factor into the reference frequency divider circuit or a second feedback division factor into the feedback frequency divider circuit in a second time period, in which the second time period occurs immediately after the first time period, and the second reference division factor or the second feedback division factor causes the PLL to lock to a target PLL output system operating frequency.

These and other implementations can optionally include one or more of the following features. The first feedback division factor or the first reference division factor can be programmed to be a maximum or a minimum division factor. When the variable oscillator is stabilized, the control circuit can be configured to program the second feedback division factor or the second reference division factor to be a steady-state frequency division factor for the target PLL output system operating frequency during the second time period.

In general, in other aspects, implementations feature a system that includes a phase-lock loop (PLL) circuit that includes an oscillator, and a programmable reference frequency divider circuit or a programmable feedback frequency divider circuit. The system includes a control circuit configured to reduce a time required for a PLL settling time by programming a division value into the programmable reference frequency divider circuit or the programmable feedback frequency divider circuit to target the oscillator to operate outside of a system operating frequency range of the oscillator during start-up of PLL operations.

These and other implementations can optionally include one or more of the following features. The control circuit can be further configured to control an output frequency of the PLL. The oscillator can have a minimum frequency that is less than a minimum output system operating frequency, and the oscillator also can have a maximum frequency that is greater than a maximum output system operating frequency. The control circuit can be further configured to program another division value into the programmable reference frequency divider circuit or the programmable feedback frequency divider circuit immediately after stabilization of the variable oscillator. The control circuit also can be configured to reduce PLL cycle slipping in the start-up of PLL operations by controlling a settling response of the PLL when causing the oscillator to operate outside of the system operating frequency range of the oscillator during the start-up of PLL operations.

The system can include a radio receiver, and a first local oscillator coupled to a first mixer of the radio receiver to mix a first local oscillator signal with a first radio frequency signal, in which the first local oscillator signal can be coupled to the first local oscillator of the PLL. The system also can have a second local oscillator coupled to a second mixer of the radio receiver to mix a second local oscillator signal with a second radio frequency signal, in which the second local oscillator signal can be coupled to the second local oscillator of the PLL. The radio receiver can be a superheterodyne receiver, an image-rejection receiver, a zero-intermediate frequency receiver, a low-intermediate frequency (IF) receiver, a direct-up transceiver, or a two-step up transceiver. The control circuit can include a digital timer circuit to facilitate timing arrangements for the time periods.

The disclosed techniques can be used in combination with other PLL speed-up techniques for additional performance improvements. For example, the techniques described can be combined with one or more conventional PLL settling time reduction techniques, such as increasing the PLL loop bandwidth during the locking time, pre-charging the loop filter node during startup, and pre-tuning the voltage controlled oscillator (VCO).

DETAILED DESCRIPTION

In PLLs, the settling time can depend on the loop bandwidth of the PLL. During the settling time, the PLL changes from one frequency to another frequency within a certain tolerance range. The locking time can be inversely proportional to a loop bandwidth of a loop filter. In some instances, however, the PLL can have slippage of a desired cycle, which is called "cycle slipping". Cycle slipping can occur if a ratio of a comparison reference frequency to the loop bandwidth increases beyond a threshold amount. A frequency error at a Phase-Frequency Detector component of the PLL may be too large for a loop filter bandwidth to correct within a desired timeframe resulting in cycle slipping. If the cycle slipping is small, then the lock time will be increased a little. However, the lock time can be severely worsened if the cycle slipping is severe.

Cycle slipping may result from having extra cycles beyond the maximum duty cycle of the PLL. This can occur, for example, when a phase detector is off by one or more cycles. Conventional techniques to reduce an occurrence of cycle slipping and to speed up the PLL involve increasing the PLL loop bandwidth, and thus the settling time, during the lock process. Other conventional techniques include pre-charging the loop filter node during startup, and/or pre-tuning the voltage controlled oscillator (VCO). In the conventional PLL, the division factors are set at startup directly to be the target system operating frequency for the PLL locking. In some implementations, the fast PLL settling time techniques described here can program the division factors at startup in two steps instead of the one step conventional PLL lock method. These fast PLL start-up techniques can utilize the frequency dividers in a conventional PLL without requiring additional circuits except one or both of the frequency dividers need to be programmable. The PLL settling time can be sped up by merely programming the division factors of the frequency dividers for frequencies outside, at, or near the PLL system operating frequency range. Then, as soon as the VCO is stabilized, the control circuit can then program the frequency dividers to a steady state division factors for a target system operating frequency for the PLL locking. In some implementations, the described techniques can be combined with conventional cycle slipping reduction techniques.

Figure 1:
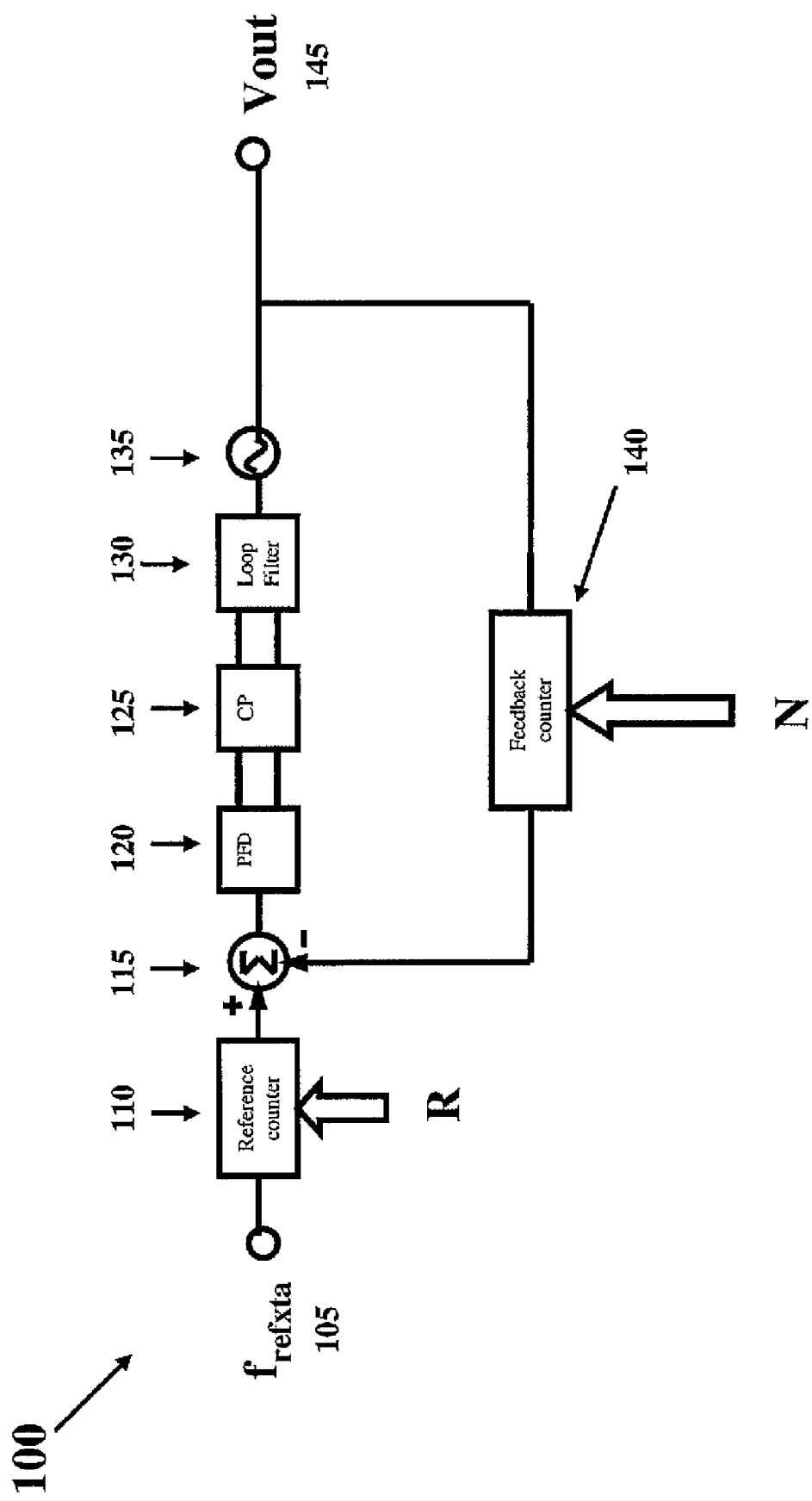
FIG. 1 is an example schematic of a design for a PLL start-up technique.

FIG. 1 shows an example schematic of a design for a conventional PLL. In general, a PLL can have two dividers, one to divide the crystal reference frequency, known as the reference frequency divider, and one to divide the VCO frequency, known as the feedback frequency divider. In conventional designs, a division factor of the reference frequency divider and a division factor of the feedback frequency divider are set to fixed values, for example, R and N, respectively, where the PLL output frequency is determined by the ratio $N/R*f_{refxtal}$, where $f_{refxtal}$ is the reference crystal frequency.

In particular, for a conventional PLL, FIG. 1 shows that a reference signal 105 enters a reference frequency divider counter 110. A summer 115 sums the output of the reference frequency divider counter 110 and an output of a feedback frequency divider 140. An output of the summer 115 is sent to a phase/frequency detector (PFD) 120 and then a charge pump (CP) 125. The output of the CP 125 is sent to a loop filter 130, followed by a VCO 135. The VCO output, Vout 145, is coupled back into the feedback frequency divider counter 140. The reference frequency divider counter 110 and/or the feedback frequency divider counter 140 are set to the same fixed values during transient settling and locked conditions of the PLL.

Figure 2:
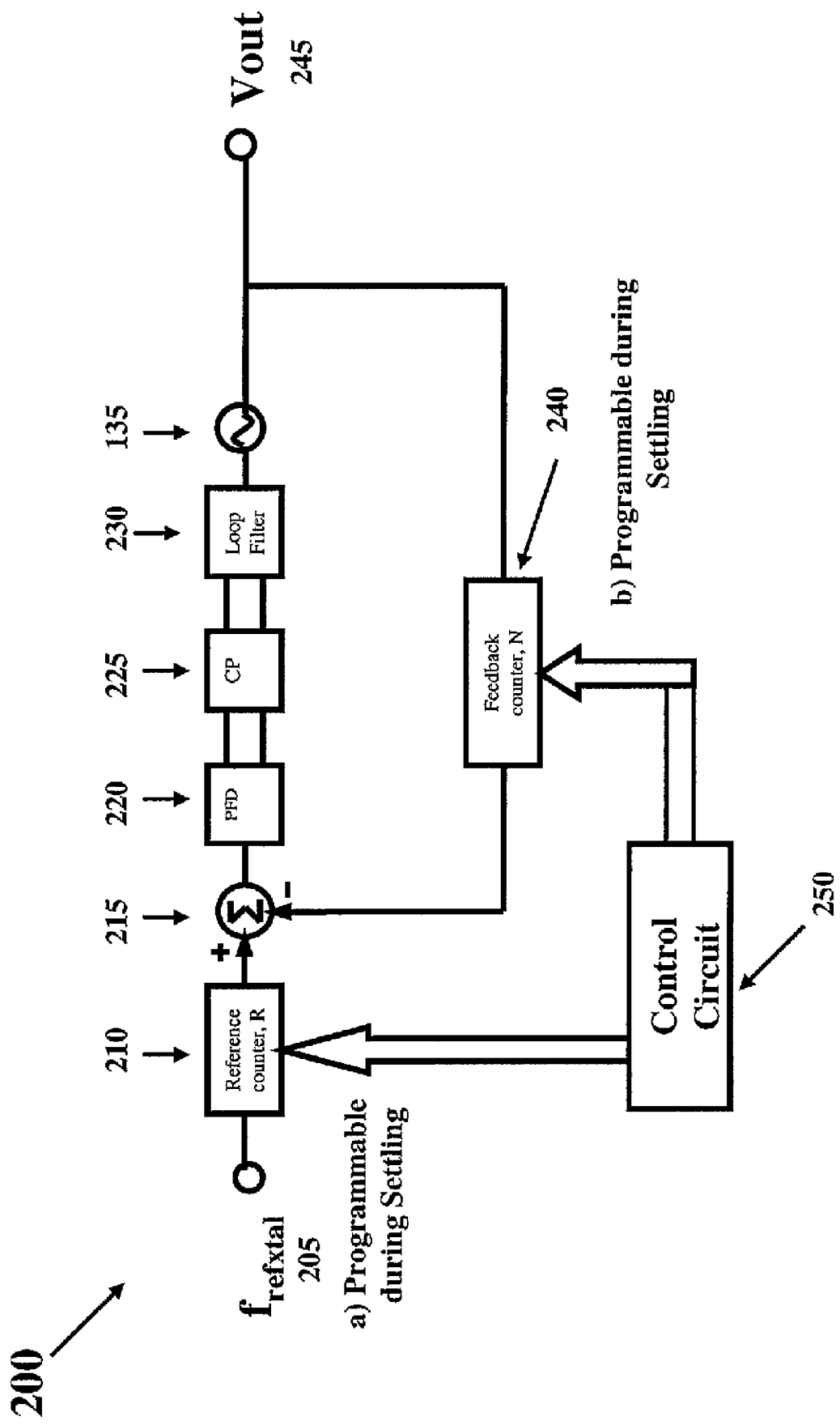
FIG. 2 is an example embodiment of a PLL fast start-up technique.

FIG. 2 shows an example schematic of a design for a PLL using such start-up techniques. In particular, FIG. 2 shows that a crystal reference signal 205 enters a reference frequency divider counter 210. A summer 215 sums the output of the reference frequency divider 210 and an output of a feedback frequency divider counter 240. An output of the summer 215 is sent to a phase-frequency-detector (PFD) 220 and then a charge pump (CP) 225. The output of the CP 225 is sent to a loop filter 230, followed by a VCO 235. The VCO output, Vout 245, is coupled back into the feedback frequency divider counter 240. The values of the reference frequency divider counter 210 and/or the feedback frequency divider counter 240 are programmable during settling/locking period by the control circuit. The digital control circuit 250 controls the programming of the division factors of the reference frequency divider 210 and the feedback frequency divider 240 with the division factor values and the programming timing.

In general, FIG. 2 shows a design that can address the issue of cycle slipping by reducing an amount of time that the PLL spends in a cycle slipping situation. This can be accomplished by programming the reference frequency divider division factor, R, during the start-up acquisition/locking time. Alternatively, this can be accomplished by programming the feedback frequency divider division factor, N, during start-up.

In some implementations, a voltage controlled oscillator (VCO) can have a VCO frequency range of $f_1$-$f_h$ and a system operating frequency range of $f_{min}$-$f_{max}$, where $f_1 < f_{min} < f_{max} < f_h$. The maximum VCO frequency is $f_h$ and the minimum VCO frequency is $f_1$. By making adjustments to the reference division factor, R, the feedback division factor, N, or both the reference and feedback division factors, R and N, simultaneously at start-up, the VCO can be targeted to oscillate at, near, or above the maximum system operating frequency, $f_{max}$, or at, near, or below the minimum system operating frequency $f_{min}$ to recover more quickly from the cycle slipping condition than conventional cycle slipping reduction techniques. One or both of the division factors, R or N, can be dynamically changed during start-up to reduce cycle slipping, which can reduce the settling time.

Upon PLL start-up (either the initial operation or when switching frequencies), the phase state of the VCO output is unknown. Rather than allowing this unknown state to cause the PLL loop filter voltage to overshoot and jump between the power supply rails in an arbitrary fashion, control circuit 250 controls the start-up by setting a targeted PLL output frequency such that the PLL locking process can be predictable and the time spent during the cycle slipping state can be minimized. In some implementations, the desired PLL output frequency $f_o$ is $N/R*f_{refxtal}$, where a change to either divider affecting N or R can affect the PLL output frequency. The time to employ the techniques in cycle slipping and settling time reduction can be during the transient settling period.

The PLL can be designed with analog, digital or mixed-signal PLLs. The techniques described here for settling time speed-up and cycle slipping reduction at start-up also can be applied to other PLL architectures such as an integer-N PLL, a fractional-N PLL, or a type-L and Mth-order PLL, where the "type" of a PLL indicating the number of perfect integrators in the loop, and the "order" of a PLL indicates the total number of poles in the loop transfer functions.

Accordingly, the control circuit 250 sets an initial target PLL output frequency during the transient settling process (start-up process) so as to reduce the time spent during the cycle slipping state by adjusting the division factor values N or/and R. After the variable oscillator stabilizes, the control circuit 250 sets a new target PLL output frequency to a target output system operating frequency by adjusting the division factor to steady-state values.

In the condition where the VCO startup is faster than the PLL reference divider and charge pump, the VCO frequency can start out to be initially higher or lower than the desired frequency. In such cases, loop filter voltage can be pumped up or down, arbitrarily causing long and unpredictable locking and settling times. However, by setting the feedback frequency divider division factor, N, to the maximum designed division factor value, $N_{max}$, or a value such that the initial target PLL output frequency can be at, near, or above the top end of the VCO system operating frequency, $f_{max}$, the loop can react by trying to speed up the VCO. As soon as the VCO has stabilized, the value of N can then be switched to a proper steady-state N value for a targeted PLL system operating frequency, and the PLL can then lock to the proper system operating frequency in a predictable manner that reduces the amount of locking and settling times for the PLL.

Alternatively the division factor of the feedback frequency divider can be set to a minimum dividing factor value, $N_{min}$, or a value such that the target PLL output frequency can be at, near or below the low end of VCO output system operating frequency, $f_{min}$. The loop can slow down the VCO by causing the loop filter output to be driven to ground during the initial transient period. As soon as the VCO has stabilized, the value of N can then be switched to the proper steady-state system operating N value for a targeted PLL system operating frequency, and the PLL can lock to the proper frequency in a predictable manner that reduces the amount of the locking and settling times for the PLL.

In other implementations, the techniques described above can be used by changing the reference division factor, R, in a similar manner to affect the PLL start-up during the cycle slipping portion of the transient PLL start-up. In some implementations, similar techniques can also be used by changing the ratio N/R by simultaneously programming both the feedback division factor, N, and the reference division factor, R, in a similar manner as described above to affect the PLL start-up during the cycle slipping portion of the transient PLL start-up.

In general, the VCO can produce numerous signal edges that can be used to increase a number of phase comparisons. In some cases, it can be desirable to set the VCO to the maximum frequency, $f_h$, and in other cases to the minimum frequency, $f_1$ at start-up to reduce cycle slipping and settling time. Some of the cases can be, for example, cases where the VCO start-up is set slow to keep the loop filter from allowing a signal to overshoot. Using the techniques described above, the locking time and the settling time of a PLL can be improved by changing the division factors N and R, separately or simultaneously, for the frequency dividers of the PLL during the locking and settling process.

Accordingly, to address the issue of cycle slipping, the control circuit 250 changes a reference frequency in the reference frequency divider 210 by changing the reference frequency division factor R to a value that increases or decreases the VCO frequency, then to a division factor value for the steady-state system operating frequency during the start-up acquisition/locking period. Alternatively, the control circuit accomplishes this by changing the division factor N for the feedback frequency divider counter 240 during start-up, or by changing both R and N simultaneously.

Figure 3:
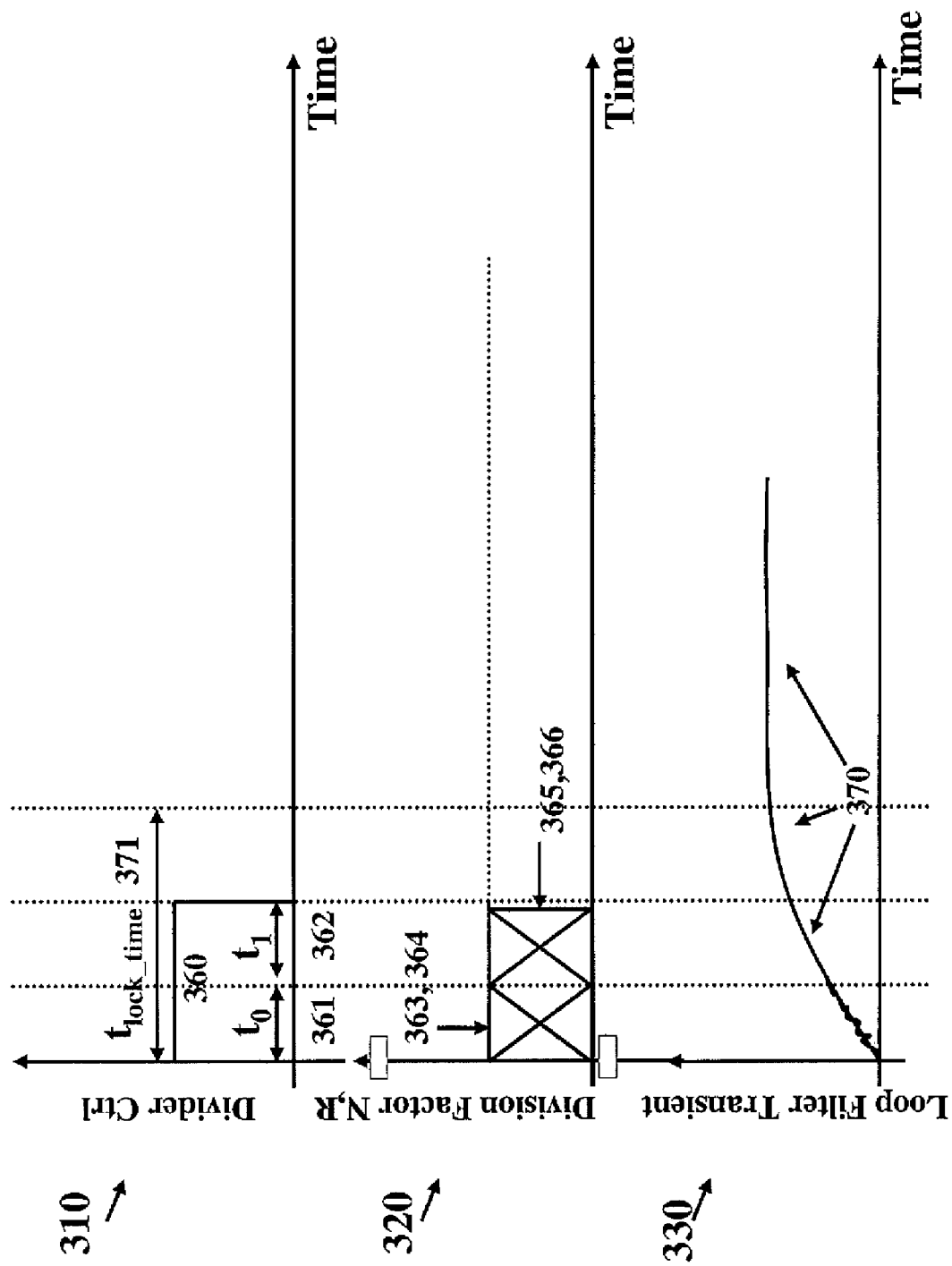
FIG. 3 shows example diagrams for settling time.

FIG. 3 shows timing diagrams 310, 320, 330 for an example settling time and transient response. In particular, the timing diagrams 310, 320, 330 in FIG. 3 illustrate the timing and control that can be required to affect the PLL transient settling time. Timing diagram 310 shows a timing diagram of a divider control signal versus time. In timing diagram 310, a control signal 360 is applied to one or both of the frequency dividers to enable the programming of the division factors, N and R. When the control signal 360 is high, it can cause different values to be loaded into the reference or feedback frequency dividers to speed up the PLL locking and settling. During a first time period, $t_0$ 361, initial division factors can be programmed into the dividers. During a second time period $t_1$ 362, the steady-state division factors can be programmed into the dividers. The time periods $t_0$ 361 and $t_1$ 362, where $0 < t_0 < (t_0+t_1) < t_{lock\_time}$ 371 can be controlled by digital timers that are generated by the control circuit 250, as shown in FIG. 2. In some implementations, the digital timers are within the control circuit 250.

Timing diagram 320 shows programming for division factors, N and R, versus time. In particular, timing diagram 320 shows that the startup value of N 363, R 364, or both N 363 and R 364 can be programmed into the frequency dividers when the control signal 360 goes high during the first time period $t_0$ 361. Steady state values of N 365 and R 366, or both N 365 and R 366 can be later programmed into the dividers during the second time period $t_1$ 362. Timing diagram 330 shows a PLL loop filter transient response versus time. In particular, timing diagram 330 shows the PLL loop filter voltage settling response for the PLL loop filter voltage 370, where the voltage 370 increases during the second time period $t_1$ 362 and settles thereafter at $t_{lock\_time}$ 371. Generally, the divider programming should take place during the beginning of the PLL settling process where cycle slipping tends to be most prevalent.

In some implementations, the feedback frequency divider can be programmed to a division factor, N, and the reference frequency divider can be programmed by the control circuit to a highest reference division factor, $R_{max}$, a lowest reference division factor, $R_{min}$, or an initial reference dividing factor $R_{init}$, such that the target initial VCO frequency is outside a specified VCO system operating frequency range $f_{min}$-$f_{max}$ at PLL startup. The reference frequency divider can be later programmed by the control circuit to a steady-state reference division factor R during the later steady-state programming time period, $t_1$.

When the target initial VCO frequency is outside a specified VCO system operating frequency range at PLL startup, the output frequency of the PLL is outside of a designed PLL system operating frequency range. In these implementations, $N_{max}/R$, $N_{min}/R$, $N/R_{max}$, $N/R_{min}$, $N_{min}/R_{max}$, or $N_{max}/R_{min}$ can provide output frequencies outside the PLL output system operating frequency range. The initial values used of the division factors N and R are not limited to the values described above. Other implementations can use different values for the initial division factors N and R from the values described above, as long as the initial division factors used generally can provide targeted initial PLL frequencies outside of a designed PLL system operating frequency range.

Figure 4:
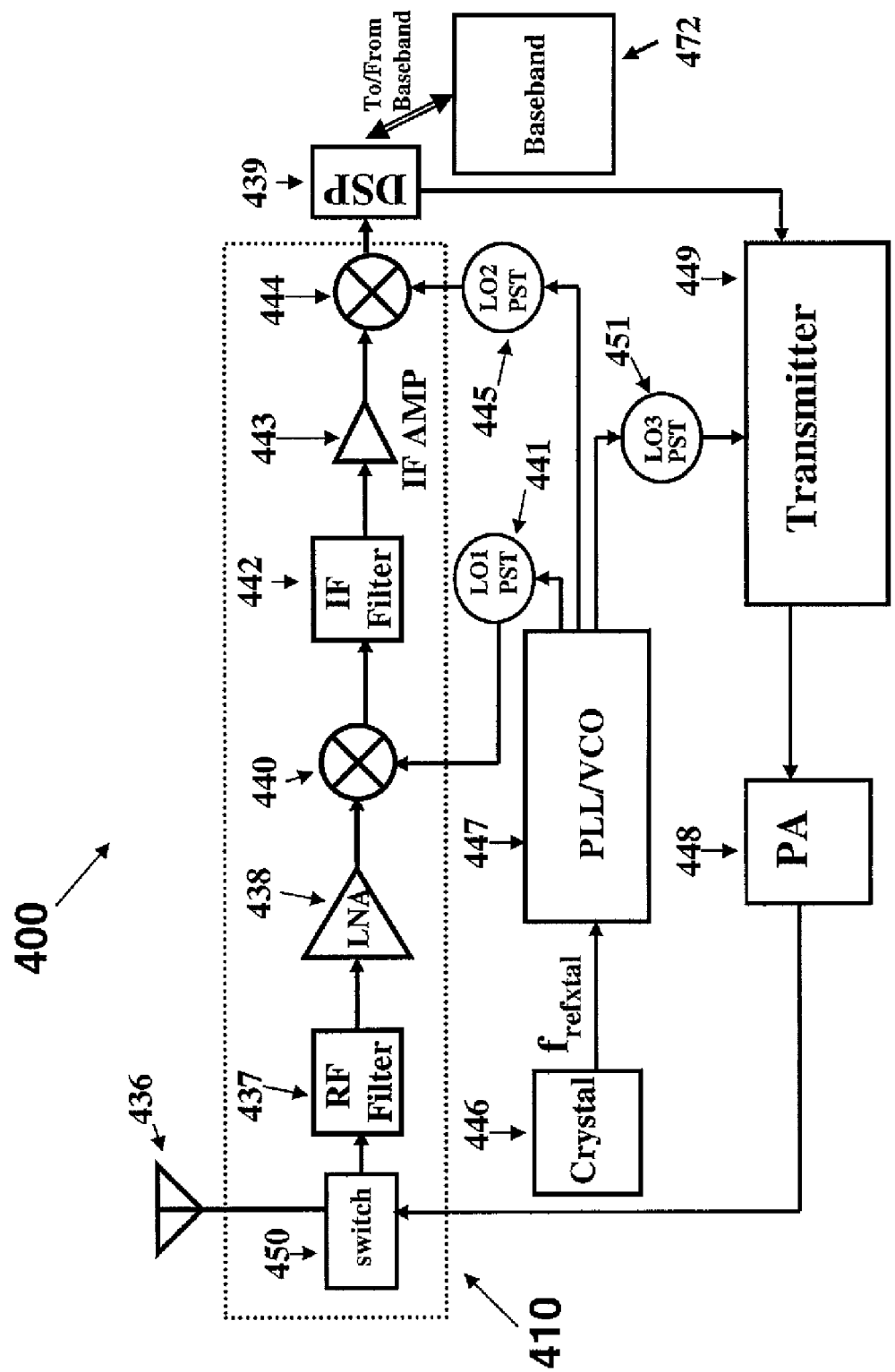
FIG. 4 is an example embodiment illustrating a schematic of a multi-band low IF radio.
Figure 5:
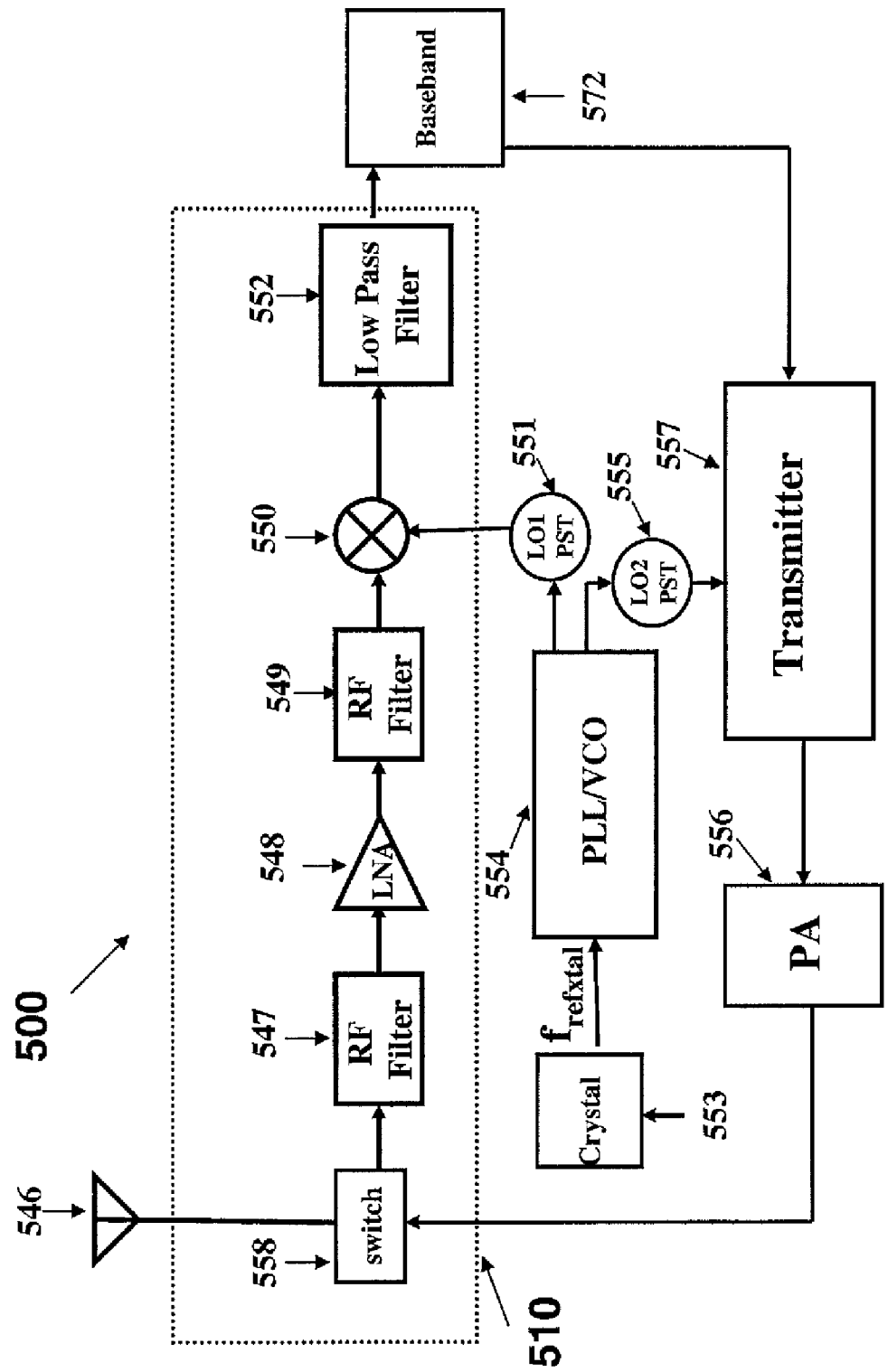
FIG. 5 is an example embodiment illustrating a schematic of a direct-conversion radio.

The disclosed techniques can be used with wireless communication systems. For example, the disclosed techniques can be used with receivers, transmitters, and transceivers, such as the receiver, transmitter, and/or transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. FIGS. 4 and 5 are schematics demonstrating two examples of systems in which the PLL timing techniques described above can be used.

In particular, FIG. 4 is a schematic of a multiband-band radio 400 with a low intermediate frequency (IF) receiver 410. In FIG. 4, a crystal 446 with a crystal reference frequency, $f_{refxtal}$, to input to a PLL/VCO circuit 447 with the phase-locked loop start-up techniques described herein. The PLL/VCO circuit 447 provides output signals to a first LO phase shifter and tuner (PST) 441, a second LO PST 445, and a third LO PST 451. An RF signal arriving at an antenna 436 passes through a switch 450, a RF filter 437, a selected low noise amplifier (LNA) 438 that has a set of LNAs with each LNA dedicated to a frequency band, and into the first mixer 440. The first mixer 440 performs image rejection and translates the RF signal down to an intermediate frequency by mixing it with the signal produced by the first LO PST 441. The undesired mixer products in the IF signal are rejected by an IF filter 442. The filtered IF signal then enters an IF amplifier stage 443, after which the outputs feeds into the second mixer 444 that translates the signal down to yet another intermediate frequency by mixing it with the signal produced by the second LO PST 445. The signal is then sent to a digital-signal-processing (DSP) unit 439 with analog-to-digital converters (ADCs) and digital-to-analog (DACs) converters for digital-signal processing. Then, the processed output signal is sent to the baseband 472 for processing. Tuning into a particular channel within the band-limited RF signal is accomplished by varying the frequency of each LO PST 441 and 445 via the PLL/VCO 447.

For radio transmission, the baseband 472 sends a signal to a transmitter 449 through the digital-signal-processing unit DSP 439 to modulate and to mix with a signal generated by the third LO PST 451. A modulated and up converted output signal of the transmitter 449 is sent to a power amplifier (PA) 448. An RF output of the PA 448 is then sent to the switch 450 connected to the antenna 436 for transmission.

In another example, FIG. 5 is a schematic of a direct-conversion radio 500 with direct-conversion receiver 510. In FIG. 5, a crystal 553 with a reference crystal frequency, $f_{refxtal}$, for an input of a PLL/VCO 354 with the phase-locked loop start-up techniques described herein to further provide signals to a first LO PST 551 and a second LO PST 555. An antenna 546 couples a RF signal through a switch 558, a first bandpass RF filter 547, and then into a selected LNA 548. The signal then proceeds through a second RF filter 549, yielding a band-limited RF signal, which then enters a mixer 550. This band-limited RF signal mixes with a first LO frequency produced by the first LO PST 551. The output of the mixer 550 is coupled into a lowpass analog filter 552 before proceeding into baseband's 572 information signal for use by the remainder of the communications system. For radio transmission, the baseband 572 sends a signal to a transmitter 557 to modulate and to mix with a signal generated by the second LO PST 555. A modulated and up-converted output signal of the transmitter 557 is sent to a power amplifier (PA) 556. An RF output of the PA 556 is then sent to the switch 558 connected to the antenna 546 for transmission.

In some implementations, different timing controls can be used, differing values can be loaded into the reference and feedback dividers, and even multiple values can be loaded into the dividers during the transient startup process. The exemplary designs may use various process technologies, such as, for example, CMOS or BiCMOS (Bipolar-CMOS) process technology, or Silicon Germanium (SiGe) technology.

In some implementations, the techniques described in this disclosure can be used with radio architectures that support multiple communication standards, such as GSM/EDGE/WEDGE, and emerging standards, such as WiMAX, LTE, and UMB. The techniques in this disclosure can also be used with multi-band radios, GPS, RX Diversity, WLAN, and FM/DTV receivers.

The PLL can be an analog, a digital or a combined analog and digital PLL. The PLL can be an integer-based PLL, a fractional-based PLL, or a combined integer and fractional-based PLL. The PLL can be of any type, of any order, and can be a single-loop or multi-loop PLL. The division factors for N and/or R can be equal to one in some cases. In some implementations, the crystal oscillator can be replaced by a dielectric resonator or an acoustic wave resonator. The system can also include summers, mixers, filters, analog-to-digital converters (ADCs), digital-to-analog converters (DACs), and analog and digital control circuits. Some of the programmable frequency dividers can be counters, prescalers or dividers with input amplifiers.

In some implementations, the VCO can be replaced by a current controlled-oscillator, a ring oscillator, a relaxation oscillator, a Colpitts oscillator, a Hartley oscillator, a two-integrator oscillator, an LC oscillator, or an RC oscillator. The PLL can be single-ended, differential, or combined single-ended and differential MOSFETS or bipolar circuits.

In some implementations, the disclosed PLL can be combined with one or more techniques for increasing the loop filter bandwidth initially, and then the bandwidth can be switched back to narrower bandwidth after locking, and/or pre-charging the loop filter node, and/or pre-tuning the VCO with one or more disclosed or conventional cycle slipping reduction techniques.

The system can include other components. Some of the components can include computers, processors, clocks, radios, signal generators, counters, test and measurement equipment, function generators, oscilloscopes, frequency synthesizers, phones, wireless communication devices, and components for the production and transmission of audio, video, and other data. The techniques disclosed herein can be used to improve conventional PLL start-up techniques, and can include pre-charging the loop filter during startup. Other modifications are within the scope of the following claims.

What is claimed is:

1. A method of operating a phase-locked loop (PLL) comprising a variable oscillator, the method comprising:
    in a first time period, programming a first reference division factor into a reference frequency divider circuit or a first feedback division factor into a feedback frequency divider circuit, the first reference division factor or the first feedback division factor causing the variable oscillator to operate outside a system operating frequency range of the variable oscillator; and
    in a second time period, programming a second reference division factor into the reference frequency divider circuit or a second feedback division factor into the feedback frequency divider circuit, wherein the second time period occurs immediately after the first time period, and the second reference division factor or the second feedback division factor causing the PLL to lock to a target PLL output system operating frequency, the reference frequency divider circuit is configured to divide a crystal reference frequency, and the feedback frequency divider circuit is configured to divide a frequency of the variable oscillator.

2. The method of claim 1, wherein the first feedback division factor is programmed to a maximum division factor.

3. The method of claim 2, further comprising:
    when the variable oscillator is stabilized, programming the second feedback division factor to be a steady-state frequency division factor for the target PLL system operating frequency during the second time period.

4. The method of claim 1, wherein the first reference division factor or the first feedback division factor is programmed to a target PLL output frequency that is at or near an upper most range value of a target PLL output system operating frequency range.

5. The method of claim 4, wherein the second reference division factor or the second feedback division factor is programmed to be a steady-state frequency division factor for the target PLL output system operating frequency when the variable oscillator is stabilized.

6. The method of claim 5, wherein the target PLL output frequency is a function of the division factors and the reference frequency.

7. The method of claim 1, wherein the first feedback division factor or the first reference division factor is programmed to be a minimum division factor.

8. The method of claim 7, further comprising:
    when the variable oscillator is stabilized, programming the second feedback division factor or the second reference division factor to be a steady-state frequency division factor for the target PLL output system operating frequency.

9. The method of claim 1, wherein the first reference division factor or the first feedback division factor is programmed to set a target PLL output frequency to be at or near a lowest range value of a target PLL output system operating frequency range.

10. The method of claim 9, wherein when the frequency of the variable oscillator is stabilized, programming the second feedback division factor or the second reference division factor to be a steady-state frequency division factor for the target PLL output system operating frequency.

11. The method of claim 1, wherein a ratio of the first feedback and first reference division factors is programmed to the feedback frequency divider circuit and the reference frequency divider circuit to set a target PLL output frequency to be outside an oscillator system operating frequency range.

12. The method of claim 1, wherein the variable oscillator comprises a frequency range with a minimum frequency that is less than a lowest frequency of a PLL output system operating frequency range, and a maximum frequency that is greater than an upper most frequency of the PLL output system operating frequency range.

13. The method of claim 1, wherein the PLL comprises an analog PLL, a digital PLL or a mixed signal PLL.

14. The method of claim 1, wherein a ratio of the first feedback and first reference division factors is programmed to the feedback frequency divider circuit and the reference frequency divider circuit to set a target PLL output frequency to be at or near a lowest or an upper most frequency of an oscillator system operating frequency range.

15. The method of claim 1, further comprising increasing a PLL loop bandwidth, pre-charge a loop filter node, or pre-tuning the variable oscillator during the first time period.

16. The method of claim 1, wherein the programming in the first time period comprises setting a ratio of the first reference division factor and the first feedback division factor to adjust the target PLL output system operating frequency.

17. A circuit comprising a phase-locked loop (PLL) with a variable oscillator, the circuit comprising:
 a reference frequency divider circuit configured to divide a reference frequency;
 a feedback frequency divider circuit configured to divide a frequency of the variable oscillator; and
 a control circuit configured to:
  program a first reference division factor into the reference frequency divider circuit or a first feedback division factor into the feedback frequency divider circuit in a first time period, the first reference division factor or the first feedback division factor causing the variable oscillator to operate outside a system operating frequency range of the variable oscillator; and
  program a second reference division factor into the reference frequency divider circuit or a second feedback division factor into the feedback frequency divider circuit in a second time period, wherein the second time period occurs immediately after the first time period, and the second reference division factor or the second feedback division factor causes the PLL to lock to a target PLL output system operating frequency.

18. The circuit of claim 17, wherein the first feedback division factor or the first reference division factor is programmed to be a maximum or a minimum division factor.

19. The circuit of claim 18, further comprising:
 when the variable oscillator is stabilized, the control circuit is configured to program the second feedback division factor or the second reference division factor to be a steady-state frequency division factor for the target PLL output system operating frequency during the second time period.

20. The circuit of claim 18, wherein the control circuit comprises a digital timer circuit to facilitate timing arrangements for the time periods.

21. A system comprising:
 a phase-lock loop (PLL) circuit comprising a programmable reference frequency divider circuit or a programmable feedback frequency divider circuit, the PLL comprising an oscillator;
 a control circuit configured to reduce a time required for a PLL settling time by programming a division value into at least one of the programmable reference frequency divider circuit or the programmable feedback frequency divider circuit to target the oscillator to operate outside of a system operating frequency range of the oscillator during start-up of PLL operations.

22. The system of claim 21, wherein the control circuit is further configured to control an output frequency of the PLL.

23. The system of claim 21, wherein the oscillator has a minimum frequency that is less than a minimum output system operating frequency, and the oscillator has a maximum frequency that is greater than a maximum output system operating frequency.

24. The system of claim 21, wherein the control circuit is further configured to program another division value into the at least one of the programmable reference frequency divider circuit or the programmable feedback frequency divider circuit immediately after stabilization of the variable oscillator.

25. The system of claim 24, wherein the control circuit is configured to reduce PLL cycle slipping in the start-up of PLL operations by controlling a settling response of the PLL when causing the oscillator to operate outside of the system operating frequency range of the oscillator during the start-up of PLL operations.

26. The system of claim 21, further comprising:
 a radio receiver;
 a first local oscillator coupled to a first mixer of the radio receiver to mix a first local oscillator signal with a first radio frequency signal,
 wherein the first local oscillator signal is coupled to the first local oscillator of the PLL.

27. The system of claim 22, further comprising:
 a second local oscillator coupled to a second mixer of the radio receiver to mix a second local oscillator signal with a second radio frequency signal,
 wherein the second local oscillator signal is coupled to the second local oscillator of the PLL.

28. The system of claim 22, wherein the radio receiver is a superheterodyne receiver, an image-rejection receiver, a zero-intermediate frequency receiver, a low-intermediate frequency receiver, a direct-up transceiver, or a two-step up transceiver.

29. The system of claim 22, wherein the control circuit comprises a digital timer circuit to facilitate timing arrangements for the time periods.

* * * * *